United States Patent
Song

(10) Patent No.: US 12,217,019 B2
(45) Date of Patent: Feb. 4, 2025

(54) PROCESSING-IN-MEMORY DEVICES HAVING MULTIPLICATION-AND-ACCUMULATION CIRCUITS

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 528 days.

(21) Appl. No.: 17/331,426

(22) Filed: May 26, 2021

(65) Prior Publication Data

US 2022/0222045 A1 Jul. 14, 2022

Related U.S. Application Data

(63) Continuation of application No. 17/319,717, filed on May 13, 2021.

(30) Foreign Application Priority Data

Jan. 11, 2021 (KR) ........................ 10-2021-0003632

(51) Int. Cl.
*G06F 7/544* (2006.01)
*G06F 7/487* (2006.01)
(Continued)

(52) U.S. Cl.
CPC .......... *G06F 7/5443* (2013.01); *G06F 7/4876* (2013.01); *G06F 7/501* (2013.01);
(Continued)

(58) Field of Classification Search
CPC .... G06F 7/5443; G06F 17/16; G06F 15/7821; G06F 7/38–575; G06F 7/4876;
(Continued)

(56) References Cited

U.S. PATENT DOCUMENTS

| | | | |
|---|---|---|---|
| 6,848,058 B1 * | 1/2005 | Sinclair | G06F 1/3275 713/322 |
| 10,884,736 B1 * | 1/2021 | Farooqui | G06F 9/30141 |

(Continued)

FOREIGN PATENT DOCUMENTS

| KR | 1020180062910 A | 6/2018 |
|---|---|---|
| KR | 1020190074195 A | 6/2019 |

OTHER PUBLICATIONS

R. Dalrymple. n.d. GPU/CPU Programming for Engineers—Lecture 13 [PowerPoint], slides 1-19. Available: https://www.ce.jhu.edu/dalrymple/classes/602/Class13.pdf. Retrieved through Wayback Machine Snapshot from Jul. 18, 2018. (Year: 2018).*

(Continued)

*Primary Examiner* — Matthew D Sandifer
(74) *Attorney, Agent, or Firm* — WILLIAM PARK & ASSOCIATES LTD.

(57) ABSTRACT

A processing-in-memory (PIM) device includes a first memory region, a second memory region, a third memory region, and a multiplication-and-accumulation MAC circuit. The first memory region is configured to store weight data comprised of elements of a weight matrix. The second memory region is configured to store vector data comprised of elements of a vector matrix. The third memory region is configured to store constant data. The MAC circuit is configured to selectively perform a MAC arithmetic operation of the weight data and the vector data or an element-wise multiplication (EWM) arithmetic operation of the weight data and the constant data.

13 Claims, 12 Drawing Sheets

(51) Int. Cl.
  *G06F 7/501* (2006.01)
  *G11C 7/10* (2006.01)
(52) U.S. Cl.
  CPC .......... *G11C 7/1012* (2013.01); *G11C 7/106* (2013.01); *G11C 7/1087* (2013.01)
(58) Field of Classification Search
  CPC . G06F 7/501; G06F 12/02; G06F 3/06; G11C 7/1012; G11C 7/106; G11C 7/1087; G06G 17/16
  See application file for complete search history.

(56) References Cited

U.S. PATENT DOCUMENTS

| | | | |
|---|---|---|---|
| 11,244,718 B1 | 2/2022 | Xue et al. | |
| 2004/0008201 A1* | 1/2004 | Lewis | G06F 9/3887 345/503 |
| 2019/0266219 A1* | 8/2019 | Chauhan | G06N 3/08 |
| 2019/0266485 A1* | 8/2019 | Singh | G06F 9/3001 |
| 2019/0354508 A1* | 11/2019 | Mahurin | G06F 9/30036 |
| 2020/0026494 A1* | 1/2020 | Langhammer | G06F 7/501 |
| 2020/0110705 A1* | 4/2020 | Jo | G06F 9/30101 |
| 2020/0334322 A1* | 10/2020 | Liu | G06F 17/16 |
| 2021/0125044 A1* | 4/2021 | Hao | G06F 7/5318 |
| 2021/0334636 A1* | 10/2021 | Dua | G06N 3/08 |
| 2022/0036165 A1* | 2/2022 | Kwon | G06F 7/5443 |

OTHER PUBLICATIONS

K. Tatas, G. Koutroumpezis, D. Soudris, and A. Thanailakis, "Architecture design of a coarse-grain reconfigurable multiply-accumulate unit for data-intensive applications," 2007, Integration, vol. 40, No. 2, pp. 74-93. (Year: 2007).*

C. B. Bidhul, N. Hampannavar, S. Joseph, P. Jayakrishnan and S. Kumaravel, "Comparison of architectures of a coarse-grain reconfigurable multiply-accumulate unit," 2013 International Conference on Green Computing, Communication and Conservation of Energy (ICGCE), Chennai, India, 2013, pp. 225-230. (Year: 2013).*

M. Aly et al., "The N3XT approach to energy-efficient abundant-data computing," 2018, Proceedings of the IEEE, 107(1), p. 19-48. (Year: 2018).*

* cited by examiner

PROCESSING-IN-MEMORY DEVICES HAVING MULTIPLICATION-AND-ACCUMULATION CIRCUITS

CROSS-REFERENCE TO RELATED APPLICATIONS

The present application is a continuation application of U.S. patent application Ser. No. 17/319,717 filed on May 13, 2021, which claims priority under 35 U.S.C 119(a) to Korean Application No. 10-2021-0003632, filed on Jan. 11, 2021, which is incorporated herein references in its entirety.

BACKGROUND

1. Technical Field

Various embodiments of the present teachings relate to multiplication-and-accumulation (hereinafter, referred to as 'MAC') circuits and processing-in-memory (hereinafter, referred to as 'PIM') devices including the MAC circuits, and more particularly, to MAC circuits executing an element-wise multiplication (hereinafter, referred to as 'EWM') arithmetic operation between a matrix and a constant number and PIM devices including the MAC circuits.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. In general, techniques for effectively learning deep neural networks (DNNs) or deep networks having increased layers as compared with general neural networks to utilize the deep neural networks (DNNs) or the deep networks in pattern recognition or inference are commonly referred to as deep learning.

One cause of this widespread interest may be the improved performance of processors performing arithmetic operations. To improve the performance of artificial intelligence, it may be necessary to increase the number of layers constituting a neural network in the artificial intelligence to educate the artificial intelligence. This trend has continued in recent years, which has led to an exponential increase in the amount of computation required for the hardware that actually does the computation. Moreover, if the artificial intelligence employs a general hardware system including memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations internally, data processing speed in the neural network may be improved.

SUMMARY

According to an embodiment, a processing-in-memory (PIM) device includes a first memory region, a second memory region, a third memory region, and a multiplication-and-accumulation MAC circuit. The first memory region is configured to store weight data comprised of elements of a weight matrix. The second memory region is configured to store vector data comprised of elements of a vector matrix. The third memory region is configured to store constant data. The MAC circuit is configured to selectively perform a MAC arithmetic operation of the weight data and the vector data or an element-wise multiplication (EWM) arithmetic operation of the weight data and the constant data.

BRIEF DESCRIPTION OF THE DRAWINGS

Certain features of the disclosed technology are illustrated by various embodiments with reference to the attached drawings, in which.

DETAILED DESCRIPTION OF THE EMBODIMENTS

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present to disclosure. Further, when an element is referred to as being "connected"

or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals, A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be to described hereinafter in detail with reference to the accompanying drawings. However, the embodiments described herein are for illustrative purposes only and are not intended to limit the scope of the present disclosure.

Figure 1:
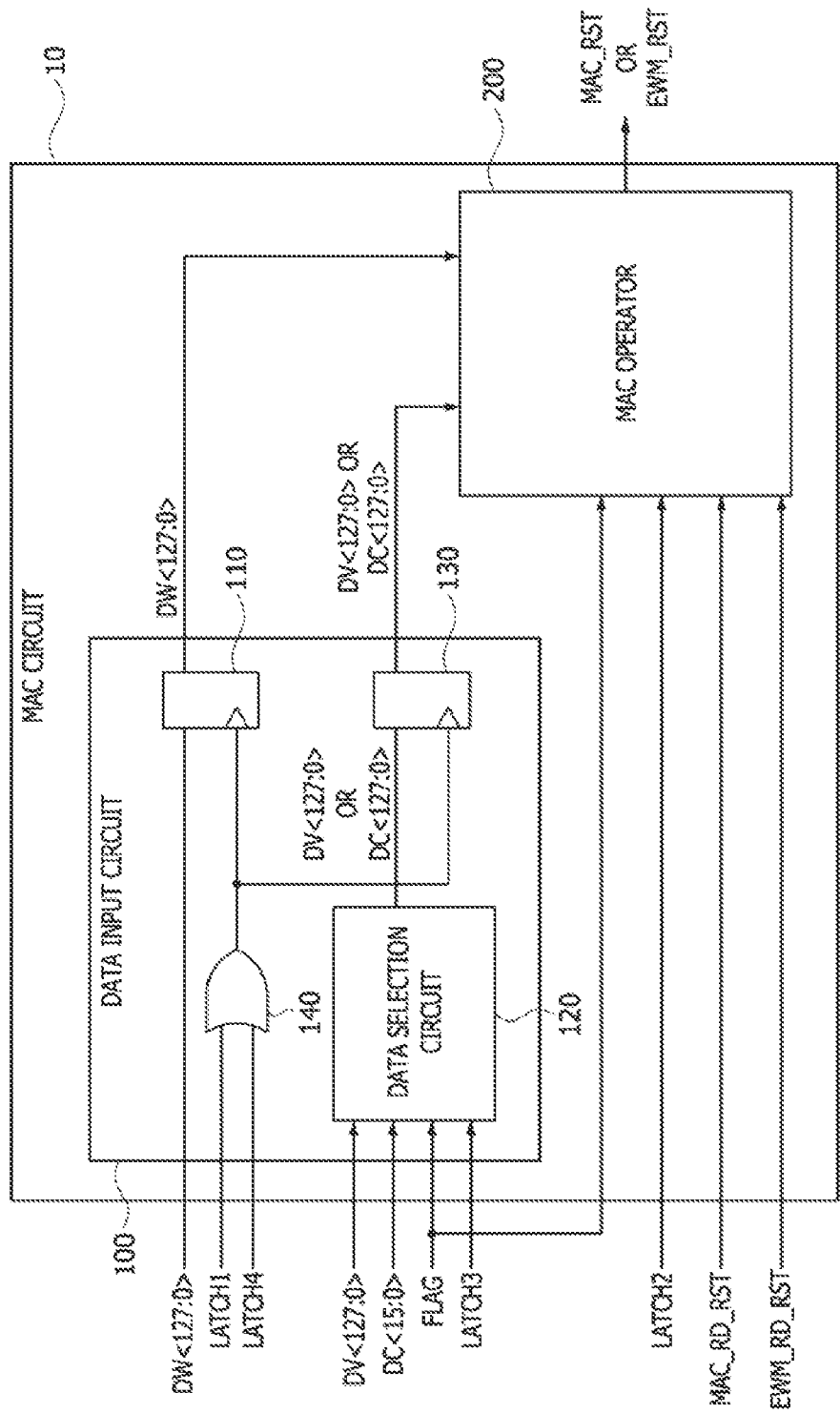
FIG. 1 illustrates a configuration of a MAC circuit according to an embodiment of the present teachings.

Various embodiments are directed to MAC circuits and PIM devices including the same, FIG. 1 illustrates a configuration of a MAC circuit 10 according to an embodiment of the present teachings. Referring to FIG. 1, the MAC circuit 10 may perform a MAC arithmetic operation and an EWM arithmetic operation. The MAC arithmetic operation may include a matrix multiplication of a weight matrix and a vector matrix. The EWM arithmetic operation may include a matrix multiplication of a weight matrix and a constant number. Thus, the MAC circuit 10 may receive weight data for the weight matrix and vector data for the vector matrix to perform the MAC arithmetic operation, and the MAC circuit 10 may receive the weight data for the weight matrix and a constant number to perform the EWM arithmetic operation.

In order to perform the MAC arithmetic operation, the MAC circuit 10 may receive weight data DW<127:0> and vector data DV<127:0> from a memory region. The MAC circuit 10 may receive a first latch control signal LATCH1 that controls a data input operation for the MAC arithmetic operation. The MAC circuit 10 may receive a second latch control signal LATCH2 that controls a data accumulation and output operation during the MAC arithmetic operation. The MAC circuit 10 may output MAC result data MAC_RST generated by the MAC arithmetic operation. The MAC circuit 10 may receive a MAC result data output control signal MAC_RD_RST that controls an output operation of the MAC result data MAC_ST.

In order to perform the EWM arithmetic operation, the MAC circuit 10 may receive the weight data DW<127:0> and constant data DC<15:0> from the memory region. The MAC circuit 10 may receive a third latch control signal LATCH3 that controls an input operation of the constant data DC<15:0> used for the EWM arithmetic operation. The MAC circuit 10 may receive a fourth latch control signal LATCH4 that controls a data input operation for the EWM arithmetic operation. The MAC circuit 10 may output EWM result data EWM_RST generated by the EWM arithmetic operation, The MAC circuit 10 may receive an EWM result data output control signal EWM_RD_RST that controls an output operation of the EWM result data EWM_RST.

Specifically, the MAC circuit 10 may include a data input circuit 100 and a MAC operator 200. The data input circuit 100 may receive the weight data DW<127:0>, the vector data DV<127:0>, and the constant data DC<15:0>. The weight data DW<127:0> may correspond to elements of the weight matrix. The vector data DV<127:0> may correspond to elements of the vector matrix. The constant data DC<15:0> may correspond to a constant number having a certain value. In the present embodiment, both of the weight data DW<127:0> and the vector data DV<127:0> may have a size of 128 bits, and the constant data DC<15:0> may have a size of 16 bits. However, the present embodiment may be merely an example of the present disclosure. Thus, the sizes of the weight data DW<127:0>, the vector data DV<127:0>, and the constant data DC<15:0> may be different according to a size of each of the elements included in the weight matrix and the vector matrix and the computational ability of the MAC operator 200.

The data input circuit 100 may include a first input latch 110, a data selection circuit 120, a second input latch 130, and an OR gate 140. The first input latch 110 may receive the weight data DW <127:0>. The data selection circuit 120 may receive the vector data DV<127:0>, the constant data DC<15:0>, a flag signal FLAG, and the third latch control signal LATCH3. The OR gate 140 may receive the first latch control signal LATCH1 and the fourth latch control signal LATCH4. In an embodiment, the first latch control signal LATCH1 may have a logic "high" level while the MAC circuit 10 performs the MAC arithmetic operation, and the fourth latch control signal LATCH4 may have a logic "high" level while the MAC circuit 10 performs the EWM arithmetic operation.

The first input latch 110 may be synchronized with an output signal of the OR gate 140 to output the weight data DW<127:0> to the MAC operator 200. In an embodiment, the first input latch 110 may be realized using a flip-flop. The data selection circuit 120 may receive and latch the constant data DC<15:0> according to activation of the third latch control signal LATCH3 and may selectively output the vector data DV<127:0> or replica constant data DC<127:0> according to a logic level of the flag signal FLAG. A configuration of the data selection circuit 120 will be described with reference to FIG. 2 later. The second input latch 130 may be synchronized with an output signal of the OR gate 140 to output the vector data DV<127:0> or the replica constant data DC<127:0>, which is selectively outputted from the data selection circuit 120, to the MAC operator 200. The OR gate 140 may receive the first latch control signal LATCH1 and the fourth latch control signal LATCH4 to perform a logical OR operation of the first latch control signal LATCH1 and the fourth latch control signal LATCH4, The OR gate 140 may transmit a signal generated by the logical OR operation of the OR gate 140 to dock terminals of the first and second input latches 110 and 130.

Figure 2:
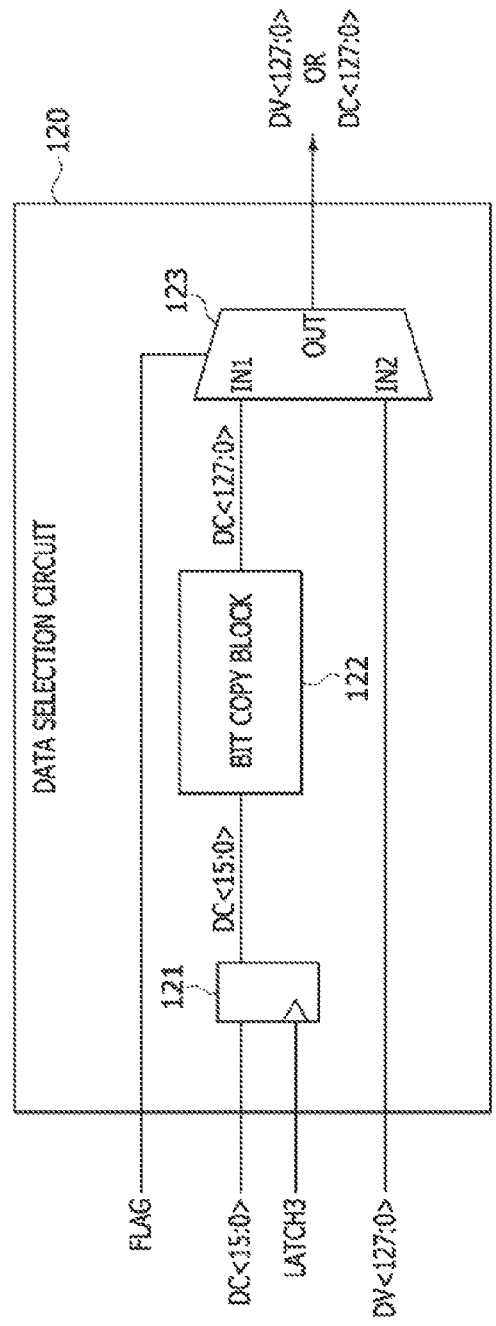
FIG. 2 illustrates a configuration of a data selection circuit included in the MAC circuit illustrated in FIG. 1.
Figure 3:
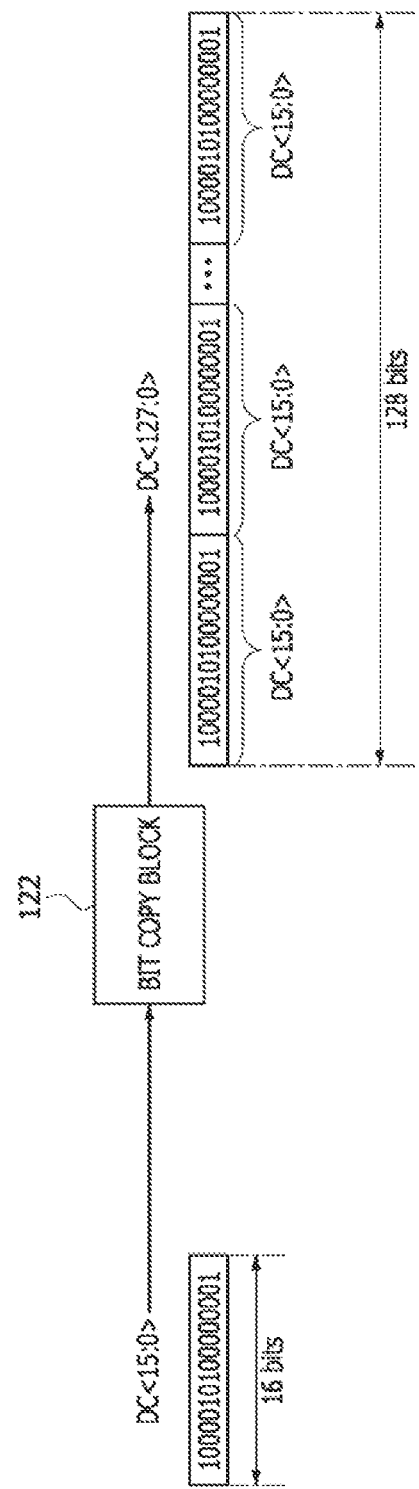
FIG. 3 is a schematic diagram illustrating an operation of a bit copy block included in the data selection circuit illustrated in FIG. 2.

FIG. 2 illustrates a configuration of the data selection circuit 120 included in the MAC circuit 10 illustrated in FIG. 1, and FIG. 3 is a schematic diagram showing input data and output data of a bit copy block 122 included in the data selection circuit 120 illustrated in FIG. 2. First, referring to FIG. 2, the data selection circuit 120 may include a third input latch 121, the bit copy block 122, and a data selection output circuit 123. The third input latch 121 may be synchronized with the third latch control signal LATCH3 to receive and output the constant data DC<15:0>. The bit copy block 122 may copy the constant data DC<15:0> outputted from the third input latch 121 to generate and output the replica constant data DC<127:0> comprised of a plurality of copied constant data DC<15:0>. The bit copy block 122 may copy the constant data DC<15:0> such that the replica constant data DC<127:0> have the same number of bits as the weight data DW<127:0> or the vector data DV<127:0>. As a result, the bit copy block 122 may receive the constant data DC<15:0> having 16 bits to output the replica constant data DC<127:0> having 128 bits.

As illustrated in FIG. 3, it may be assumed that the constant data DC<15:0> inputted to the bit copy block 122 corresponds to a 16-bit binary stream of '1000010100000001'. The bit copy block 122 may extend the number of bits of the 16-bit constant data DC<15:0> to generate the 128-bit replica constant data DC<127:0> having the same number of bits as the weight data DW<127:0>, In such a case, the bit copy block 122 may repeatedly copy the 16-bit constant data DC<15:0> corresponding to the binary stream of '1000010100000001' to array the repeatedly copied constant data DC<15:0>. In the present embodiment, the replica constant data DC<127:0> may be obtained by arraying the copied data of the constant data DC<15:0> having 16 bits eight times in series. That is, a least significant bit (LSB) of one set of two sets of the copied constant data DC<15:0> adjacent to each other among the eight sets of the copied constant data DC<15:0> constituting the replica constant data DC<127:0> may be located to be adjacent to a most significant bit (MSB) of the other set of the two adjacent sets of the copied constant data DC<15:0>.

Referring again to FIG. 2, the data selection output circuit 123 may receive the replica constant data DC<127:0> from the bit copy block 122 through a first input terminal IN1 of the data selection output circuit 123. The data selection output circuit 123 may receive the vector data DV<127:0> through a second input terminal IN2 of the data selection output circuit 123. The data selection output circuit 123 may output the replica constant data DC<127:0> inputted to the first input terminal IN1 or the vector data DV<127:0> inputted to the second input terminal IN2 through an output terminal OUT of the data selection output circuit 123 according to a logic level of the flag signal FLAG. For example, the flag signal FLAG having a logic "low" level may be transmitted to the data selection output circuit 123 to perform the MAC arithmetic operation. In such a case, the data selection output circuit 123 may output the vector data DV<127:0>, which are inputted to the second input terminal IN2, through the output terminal OUT of the data selection output circuit 123. In contrast, the flag signal FLAG having a logic "high" level may be transmitted to the data selection output circuit 123 to perform the EWM arithmetic operation. In such a case, the data selection output circuit 123 may output the replica constant data DC<127:0>, which are inputted to the first input terminal IN1, through the output terminal OUT of the data selection output circuit 123. In an embodiment, the data selection output circuit 123 may be realized using a 2-to-1 multiplexer.

Figure 4:
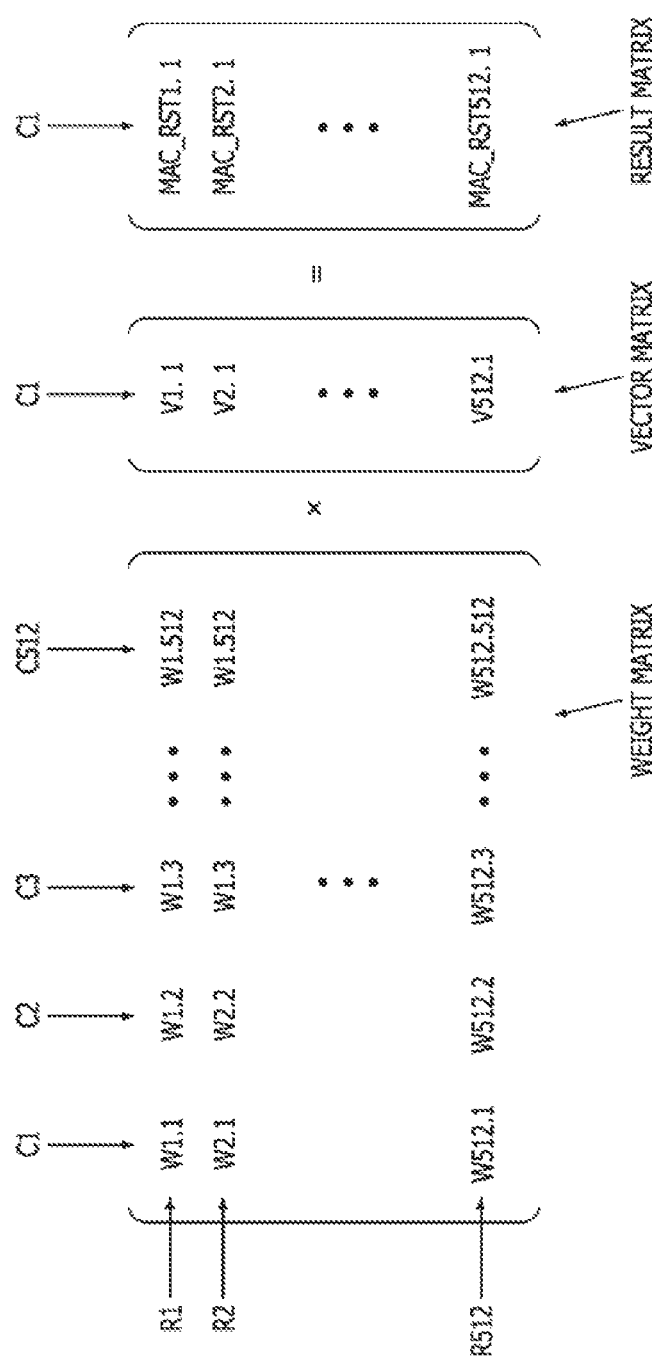
FIG. 4 illustrates a MAC arithmetic operation including a matrix multiplication of a weight matrix and a vector matrix performed by a MAC circuit according to an embodiment of the present teachings.

FIG. 4 illustrates the MAC arithmetic operation of the MAC circuit 10 according to an embodiment of the present teachings. Referring to FIG. 4, the MAC circuit 10 may perform the MAC arithmetic operation that generates a result matrix which is obtained by performing a matrix multiplication of a weight matrix and a vector matrix. The weight matrix may have TV-number of rows and SIT-number of columns, Each of the vector matrix and the result matrix may have 'N'-number of rows and one column. The number 'M' of rows included in the weight matrix may be set to be different according to the embodiments, and it may be assumed that the number 'M' of rows included in the weight matrix is 512 in the following description. Similarly, the number 'N' of columns included in the weight matrix may also be set to be different according to the embodiments, and it may be assumed that the number 'N' of columns included in the weight matrix is 512 in the following description. Thus, the weight matrix may have 512 rows (i.e., first to $512^{th}$ rows R1~R512) and 512 columns (i.e., first to $512^{th}$ columns C1~C512) and may have '512×512'-number of elements to W1.1~W1.512, . . . , and W512.1~W512.512. In addition, the vector matrix may have 512 rows (i.e., first to $512^{th}$ rows R1~R512) and one columns C1 and may have '512'-number of elements V1.1~V512.1.

In the matrix multiplication of the weight matrix and the vector matrix, sizes of the weight data and the vector data inputted to the MAC operator (200 of FIG. 1) may be determined according to a size of each of elements (W1.1~W1,512, . . . , W512.1~W512.512, and V1.1~V512.1) included in the weight matrix and the vector matrix and a calculation amount of the MAC arithmetic operation which is capable of being performed by the MAC operator 200. For example, when each of the elements included in the weight matrix and the vector matrix has a size of 2 bytes and the MAC operator 200 has 8 multipliers, the 128-bit weight data DW<127:0> and the 128-bit vector data DV<127:0> may be inputted to the MAC operator 200 like the present embodiment. In such a case, the 128-bit weight data DW<127:0> inputted to the MAC operator 200 may be comprised of 8 elements of the weight matrix, for example, the elements W1.1~W1.8 located at cross points of the first row R1 and the first to eighth columns C1~C8 of the weight matrix. In addition, the 128-bit vector data DV<127: 0> inputted to the MAC operator 200 may be comprised of 8 elements of the vector matrix, for example, the elements V1.1~W8.1 located at cross points of the first to eighth rows R1~R8 and the first column C1 of the vector matrix.

In order to obtain the MAC result data MAC_RST corresponding to an element MAC_RST1.1 located at a cross point of the first row R1 and the first column C1 of the result matrix through the MAC arithmetic operation of the MAC circuit 10, the MAC arithmetic operation has to be iteratively performed 64 times. Because the MAC arithmetic operation is executed by a matrix multiplication, an adding calculation and an accumulating calculation in addition to a multiplying calculation may also be performed to obtain the MAC result data MAC_RST.

Figure 5:
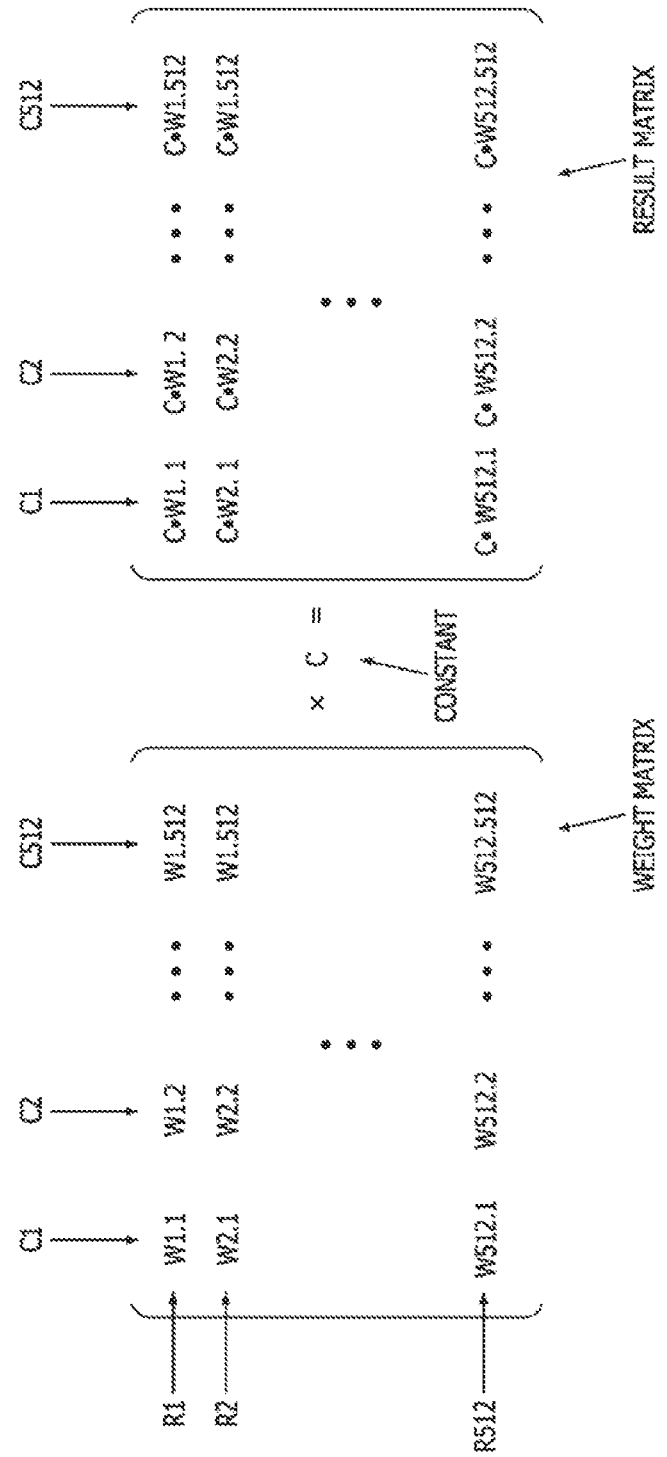
FIG. 5 illustrates an EWM arithmetic operation including a matrix multiplication of a weight matrix and a constant number performed by a MAC circuit according to an embodiment of the present teachings.

FIG. 5 illustrates the EWM arithmetic operation of the MAC circuit 10 according to an embodiment of the present teachings. Referring to FIG. 5, the MAC circuit 10 may perform the EWM arithmetic operation that generates a result matrix which is obtained by performing a matrix multiplication of a weight matrix and a constant number. In the present embodiment, it may also be assumed that the weight matrix has 512 rows (i.e., first to $512^{th}$ rows R1~R512) and 512 columns (i.e., first to $512^{th}$ columns C1~0512). While the weight matrix has '512×512'-number of elements W1.1~W1.512, . . . , and W512.1~W512.512 as described with reference to FIG. 4, the constant number may be a single data C. Result data (i.e., a result matrix) generated by the EWM arithmetic operation of the MAC circuit 10 may have the same size as the weight matrix. That is, the result matrix generated by the EWM arithmetic operation may also have 512 rows (i.e., first to $512^{th}$ rows to R1~R512) and 512 columns (i.e., first to $512^{th}$ columns C1~0512).

Elements of the result matrix may have values obtained by multiplying the elements of the weight matrix by the data C of the constant number. As such, in order to perform the EWM arithmetic operation, it may be necessary to execute only the multiplying calculations without accompanying any adding calculations and the accumulating calculations.

Figure 6:
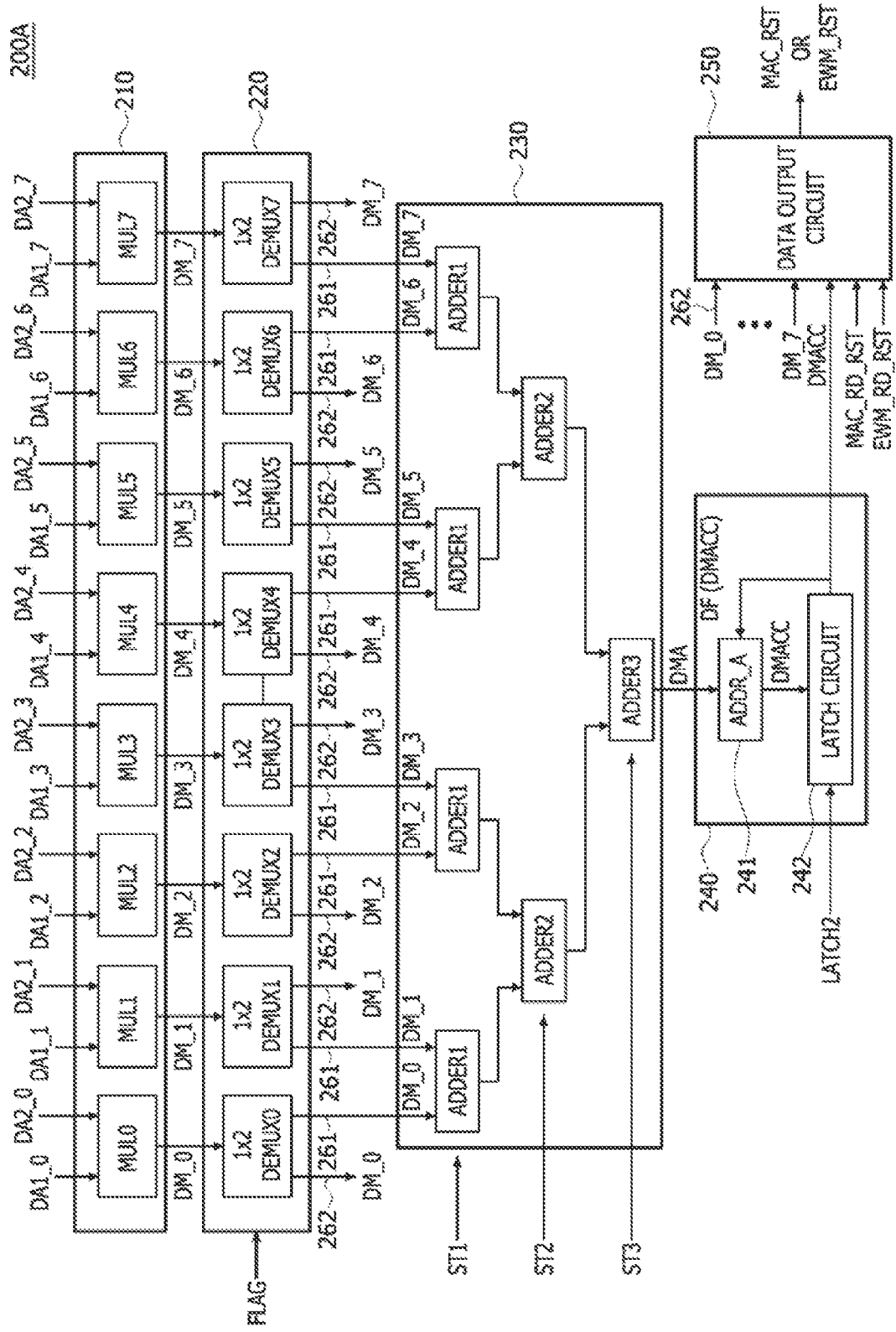
FIG. 6 is a block diagram illustrating an example of a MAC operator included in the MAC circuit illustrated in FIG. 1.
Figure 7:
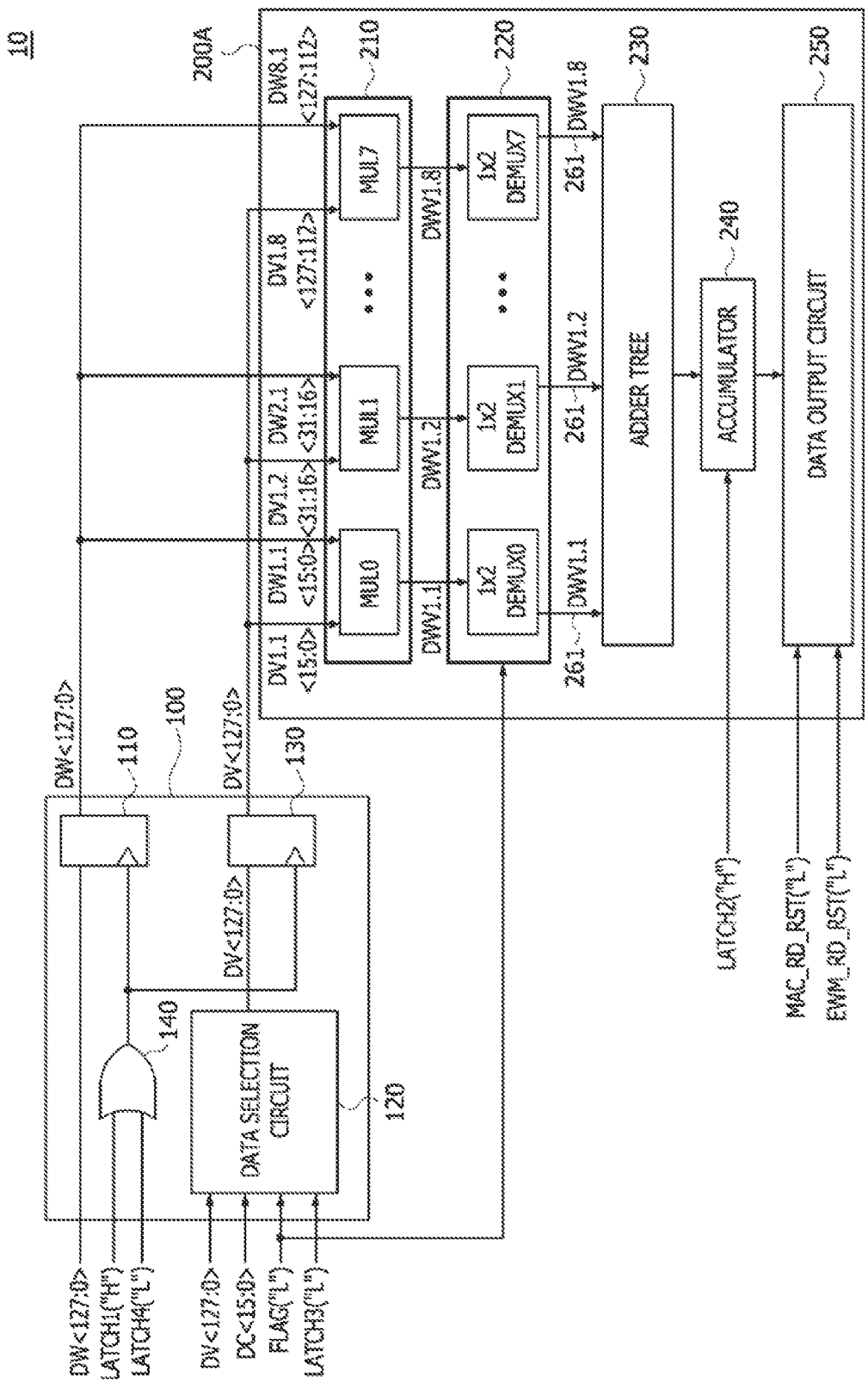
FIG. 7 illustrates a MAC arithmetic operation performed by the MAC circuit illustrated in FIG. 1.

FIG. 6 is a block diagram illustrating a configuration of a MAC operator 200A corresponding to an example of the MAC operator 200 included in the MAC circuit 10 illustrated in FIG. 1. Referring to FIGS. 6 and 7, the MAC operator 200A may include a multiplication circuit 210, a data output selection circuit 220, an adder tree 230, an accumulator 240, and a data output circuit 250. As described with reference to FIGS. 4, 6 and 7, the MAC arithmetic operation may be performed by executing all of a multiplying calculation, an adding calculation, and an accumulating calculation. Thus, all of the multiplication circuit 210, the adder tree 230, and the accumulator 240 may operate during the MAC arithmetic operation. In contrast, as described with reference to FIG. 5, the EWM arithmetic operation may be performed by executing only a multiplying calculation. Thus, while the multiplication circuit 210 operates during the EWM arithmetic operation, none of the adder tree 230 and the accumulator 240 operate during the EWM arithmetic operation. Thus, the data output selection circuit 220 contains a plurality of demultiplexers that send the data to either the MAC operation or the EWM operation, depending on the FLAG signal.

Specifically, the multiplication circuit 210 may include a plurality of multipliers, for example, eight multipliers (i.e., first to eighth multipliers MUL0~MUL7) which are disposed in parallel. Parallel disposition of the plurality of multipliers means that the plurality of multipliers are disposed such that data input/output operations and multiplying calculations of the plurality of multipliers are simultaneously and independently executed. Meaning of the term 'parallel disposition' may be equally applicable to all of components disclosed in the present application. Each of the first to eighth multipliers MUL0~MUL7 may receive one (e.g., one of the elements W1.1~W1.8 of the elements of the weight matrix) of first input data DA1_0~DA1_7 and one (e.g., one of the elements V1.1~V8.1 of the elements of the vector matrix) of second input data DA2_0~DA2_7, In addition, the first to eighth multipliers MUL0~MUL7 may perform multiplying calculations of the first input data DA1_0~DA1_7 and the second input data DA2_0~DA2_7 to output first to eighth multiplication result data respectively. For example, the first multiplier MUL0 may perform a multiplying calculation of the first input data DA1_0 corresponding to the element W1.1 of the weight matrix and the second input data DA2_0 corresponding to the element V1.1 of the vector matrix to generate and output the first multiplication result data DM_0. In the same way, the eight multiplier MUL7 may perform a multiplying calculation of the first input data DA1_7 corresponding to the element W1.8 of the weight matrix and the second input data DA2_7 corresponding to the element V8.1 of the vector matrix to generate and output the eighth multiplication result data DM_7.

The data output selection circuit 220 may output the first to eighth multiplication result data DM_0~DM_7 generated by the multiplication circuit 210 through eight first output lines 261 or eight second output lines 262. The data output selection circuit 220 may include a plurality of demultiplexers, for example, first to eighth demultiplexers DEMUX0~DEMUX7 which are disposed in parallel. Each of the first to eighth demultiplexers DEMUX0~DEMUX7 may be realized using a 1-to-2 demultiplexer having one input terminal and two output terminals. The number of the demultiplexers constituting the data output selection circuit 220 may be equal to the number of the multipliers included in the multiplication circuit 210. The input terminals of the first to eighth demultiplexers DEMUX0~DEMUX7 may be coupled to output terminals of the first to eighth multipliers MUL0~MUL7, respectively. For example, the input terminal of the first demultiplexer DEMUX0 may be coupled to the output terminal of the first multiplier MUL0, and the input terminal of the second demultiplexer DEMUX1 may be coupled to the output terminal of the second multiplier MUL1 In the same way, the input terminal of the eighth demultiplexer DEMUX7 may be coupled to the to output terminal of the eighth multiplier MUL7.

In each of the demultiplexers DEMUX0~DEMUX7, selection of the output line through which the multiplication result data are outputted may be determined by the flag signal FLAG that is inputted to the data output selection circuit 220. For example, when the flag signal FLAG having a logic "low" level is inputted to the data output selection circuit 220, the demultiplexers DEFAUX0~DEMUX7 may output the first to eighth multiplication result data DM_0~DM_7, which are outputted from the multiplication circuit 210, through the first output lines 261 of the demultiplexers DEMUX0~DEMUX7. In contrast, when the flag signal FLAG having a logic "high" level is inputted to the data output selection circuit 220, the demultiplexers DEMUX0~DEMUX7 may output the first to eighth multiplication result data DM_0~DM_7, which are outputted from the multiplication circuit 210, through the second output lines 262 of the demultiplexers DEMUX0~DENIUX7.

The first output lines 261 of the de ultiplexers DEMUX0~DEMUX7 may be coupled to the adder tree 230. Thus, the multiplication result data DM_0~DM_7 outputted from the demultiplexers DEMUX0~DEMUX7 through the first output lines 261 may be transmitted to the adder tree 230. The second output lines 262 of the demultiplexers DENIUX0~DENIUX7 may be coupled to the data output circuit 250. The data output circuit 250 may output the multiplication result data which are inputted through the second output lines 262 of the demultiplexers DEMUX0~DEMUX7, as the EWM result data EWM_RST in response to the EWM result data output control signal EWM_RD_RST.

The adder tree 230 may include a plurality of adders ADDER1, ADDER2, and ADDER3 which are arrayed to have a hierarchical structure, for example, a tree structure. In the present embodiment, each of the plurality of adders ADDER1, ADDER2, and ADDER3 constituting the adder tree 230 may be realized using a half-adder. However, the present embodiment including the adder tree 230 realized using half-adders may be merely an example of the present disclosure. That is, in some other embodiment, each of the plurality of adders ADDER1, ADDER2, and ADDER3 constituting the adder tree 230 may be realized using a full-adder. A highest stage (i.e., a first stage ST1) of the adder tree 230 may include four first adders ADDER1 which are disposed in parallel. A second stage ST2 located under the first stage ST1 may include two second adders ADDER2 which are disposed in parallel. A third stage ST3 corresponding to a lowest stage of the adder tree 230 may be located under the second stage ST2 and may be comprised of one third adder ADDER3. When each of the plurality of adders ADDER1, ADDER2, and ADDER3 is a half-adder, the number of the first adders ADDER1 may be half the number of the multipliers MUL0~FAUL7 and the number of the second adders ADDER2 may be half the number of the first adders ADDER1. In addition, the number of the third adders ADDER3 may be half the number of the second adders ADDER2.

A first input terminal and a second input terminal of each of the first adders ADDER1 disposed in the first stage ST1 may be coupled to respective ones of the first output lines 261 of two demultiplexers among the first to eighth demultiplexers DEMUX0~DEMUX7 constituting the data output selection circuit 220. Thus, each of the first adders ADDER1 may perform an adding calculation of output data (i.e., the multiplication result data) of two of the demultiplexers included in the data output selection circuit 220 to generate and output addition result data. Moreover, each of the second adders ADDER2 in the second stage ST2 may perform an adding calculation of output data (i.e., the addition result data) of two of the first adders ADDER1 in the first stage ST1 to generate and output addition result data. Furthermore, the third adder ADDER3 in the third stage ST3 may perform an adding calculation of output data the addition result data) of the two second adders ADDER2 in the second stage ST2 to generate and output addition result data DMA.

The accumulator 240 may include an accumulative adder (ADDR_A) 241 and a latch circuit 242. The accumulative adder (ADDR_A) 241 may perform an adding calculation of the addition result data DMA outputted from the third adder ADDER3 in the lowest stage (i.e., the third stage ST3) and feedback data DF outputted from the latch circuit 242 to generate and output accumulation-added result data DMACC. In an embodiment, the accumulative adder (ADDR_A) 241 may be realized using a half-adder. The latch circuit 242 may receive the accumulation-added result data DMACC outputted from the accumulative adder (ADDR_A) 241. The latch circuit 242 may latch the accumulation-added result data DMACC to feedback the latched data of the accumulation-added result data DMACC corresponding to the feedback data DF to the accumulative adder (ADDR_A) 241. In an embodiment, the latch circuit 242 may include a flip-flop. When the matrix multiplications (i.e., the MAC arithmetic operation) of one row in the weight matrix and the column in the vector matrix terminates (refer to FIG. 4), the accumulation-added result data DMACC latched by the latch circuit 242 may be transmitted to the data output circuit 250. The data output circuit 250 may output the accumulation-added result data DMACC generated by the latch circuit 242 as the MAC result data MAC_RST in response to the MAC result data output control signal MAC_RD_RST.

As described above, the MAC operator 200A may perform both of the MAC arithmetic operation and the EWM arithmetic operation. When the MAC operator 200A performs the MAC arithmetic operation, output data of the demultiplexers DEMUX0~DEMUX7 constituting the data output selection circuit 220 may be transmitted to the adder tree 230 through the first output lines 261 and the addition result data DMA generated by the adder tree 230 may be transmitted to the accumulator 240, Thus, a multiplying calculation, an adding calculation, and an accumulating calculation for the MAC arithmetic operation may be normally executed. When the MAC operator 200A performs the EWM arithmetic operation, output data of the demultiplexers DEMUX0~DEMUX7 constituting the data output selection circuit 220 may be outputted from the MAC operator 200A through the second output lines 262 and the data output circuit 250. Thus, a multiplying calculation for the EWM arithmetic operation may be normally executed.

FIG. 7 illustrates the MAC arithmetic operation of the MAC circuit 10 illustrated in FIG. 1 when the MAC operator 200A is employed in the MAC circuit 10. In FIG. 7, the same reference numerals and the same reference symbols as used in FIGS. 1 and 6 may denote the same components. Thus, detailed descriptions of the same components as described with reference to FIGS. 1 and 6 will be omitted hereinafter. The present embodiment will be described in conjunction with the MAC arithmetic operation performed by the matrix multiplication of the weight matrix and the vector matrix illustrated in FIG. 4.

Referring to FIG. 7, the 128-bit weight data DW<127:0> may be inputted to the first input latch 110 of the data input circuit 100. The 128-bit weight data DW<127:0> may be comprised of the elements W1.1~W1.8 which are located at cross points of the first row R1 and the first to eighth columns C1~C8 of the weight matrix. The 128-bit vector data DV<127:0> and the 16-bit constant data DC<15:0> may be inputted to the data selection circuit 120. The 128-bit vector data DV<127:0> may be comprised of the elements V1.1~V8.1 which are located at cross points of the first to eighth rows R1~R8 and the column C1 of the vector matrix. In addition, the flag signal FLAG having a logic "low(L)" level and the third latch control signal LATCH3 having a logic "low(L)" level may be inputted to the data selection circuit 120. As described with reference to FIG. 2, the data selection circuit 120 may output the 128-bit vector data DV<127:0> based on the flag signal FLAG having a logic "low(L)" level. The 128-bit vector data DV<127:0> outputted from the data selection circuit 120 may be transmitted to the second input latch 130.

The OR gate 140 of the data input circuit 100 may receive the first latch control signal LATCH1 having a logic "high (H)" level and the fourth latch control signal LATCH4 having a logic "low(L)" level. The OR gate 140 may generate and output a signal having a logic "high(H)" level which is transmitted to the first input latch 110 and the second input latch 130. The first input latch 110 may output the 128-bit weight data DW<127:0> to the MAC operator 200A based on the signal having a logic "high(H)" level outputted from the OR gate 140, and the second input latch 130 may output the 128-bit vector data DV<127:0> to the MAC operator 200A based on the signal having a logic "high(H)" level outputted from the OR gate 140.

The 128-bit weight data DW<127:0> inputted to the MAC operator 200A may be divided into eight groups of element data which are inputted to respective ones of the first to eighth multipliers MUL0~MUL7 of the multiplication circuit 210. That is, the first multiplier MUL0 may receive first weight data DW1.1<15:0> corresponding to the element W1.1 located at a cross point of the first row R1 and the first column C1 of the weight matrix. The first weight data DW1.1<15:0> may be a binary stream comprised of first to sixteenth bits included in the 128-bit weight data DW<127:0> outputted from the data input circuit 100. In addition, the second multiplier MUL1 may receive second weight data DW1.2<31:16> corresponding to the element W1.2 located at a cross point of the first row R1 and the second column C2 of the weight matrix. The second weight data DW1.2<31:16> may be a binary stream comprised of $17^{th}$ to $32^{nd}$ bits included in the 128-bit weight data DW<127:0> outputted from the data input circuit 100, Similarly, the eighth multiplier MUL7 may receive eighth weight data DW1.8<127:112> corresponding to the element W1.8 located at a cross point of the first row R1 and the eighth column C8 of the weight matrix. The eighth weight data DW1.8<127:112> may be a binary stream comprised of $113^{th}$ to $128^{th}$ bits included in the 128-bit weight data DW<127:0> outputted from the data input circuit 100.

The 128-bit vector data DV<127:0> inputted to the MAC operator 200A may also be divided into eight groups of element data which are inputted to respective ones of the first to eighth multipliers MUL0~MUL7 of the multiplication circuit 210. That is, the first multiplier MUL0 may receive first vector data DV1.1<15:0> corresponding to the element V1.1 located at a cross point of the first row R1 and the column C1 of the vector matrix. The first vector data DV1.1<15:0> may be a binary stream comprised of first to sixteenth bits included in the 128-bit vector data DV<127:0> outputted from the data input circuit 100. In addition, the second multiplier MUL1 may receive second vector data DV2.1<31:16> corresponding to the element V2.1 located at a cross point of the second row R2 and the column C1 of the vector matrix. The second vector data DV2.1<31:16> may be a binary stream comprised of $17^{th}$ to $32^{nd}$ bits included in the 128-bit vector data DV<127:0> outputted from the data input circuit 100. Similarly, the eighth multiplier MUL7 may receive eighth vector data DV8.1<127:112> corresponding to the element V8.1 located at a cross point of the eighth row R8 and the column C1 of the vector matrix. The eighth vector data DV8.1<127:112> may be a binary stream comprised of $113^{th}$ to $128^{th}$ bits included in the 128-bit vector data DV<127:0> outputted from the data input circuit 100.

The first to eighth multipliers MUL0~MUL7 included in the multiplication circuit 210 may perform multiplying calculations of the weight data and the vector data to generate and output first to eighth multiplication result data DWV1.1, DWV1.2, . . . , and DWV1.8, respectively. The first to eighth multiplication result data DWV1.1, DWV1.2, . . . , and DWV1.8 outputted from respective ones of the first to eighth multipliers MUL0~MUL7 may be inputted to the first to eighth demultiplexers DEMUX0~DEMUX7 of the data output selection circuit 220, respectively. The first to eighth demultiplexers DEMUX0~DEMUX7 may output the first to eighth multiplication result data DWV1.1, DWV1.2, . . . , and DWV1.8 through the first output lines 261 in response to the flag signal FLAG having a logic "low(L)" level, respectively. The first to eighth multiplication result data DWV1.1, DWV1.2, . . . , and DWV1.8 outputted from the first to eighth demultiplexers DEMUX0~DEMUX7 may be transmitted to the adder tree 230.

The adder tree 230 may hierarchically perform adding calculations in the stages to generate and output the addition result data to the accumulator 240. The accumulator 240 may perform an accumulating calculation in response to the second latch control signal LATCH2 having a logic "high (H)" level. Data generated by the accumulating calculation of the accumulator 240 may be latched in the accumulator 240 to provide the feedback data DF. The feedback data DF may also be transmitted to the data output circuit 250. Because the matrix multiplications for all of the elements included in the weight matrix and the vector matrix are not completed, both of the MAC result data output control signal MAC_RD_RST and the EWM result data output control signal EWM_RD_RST inputted to the data output circuit 250 may have a logic "low(L)" level.

Figure 8:
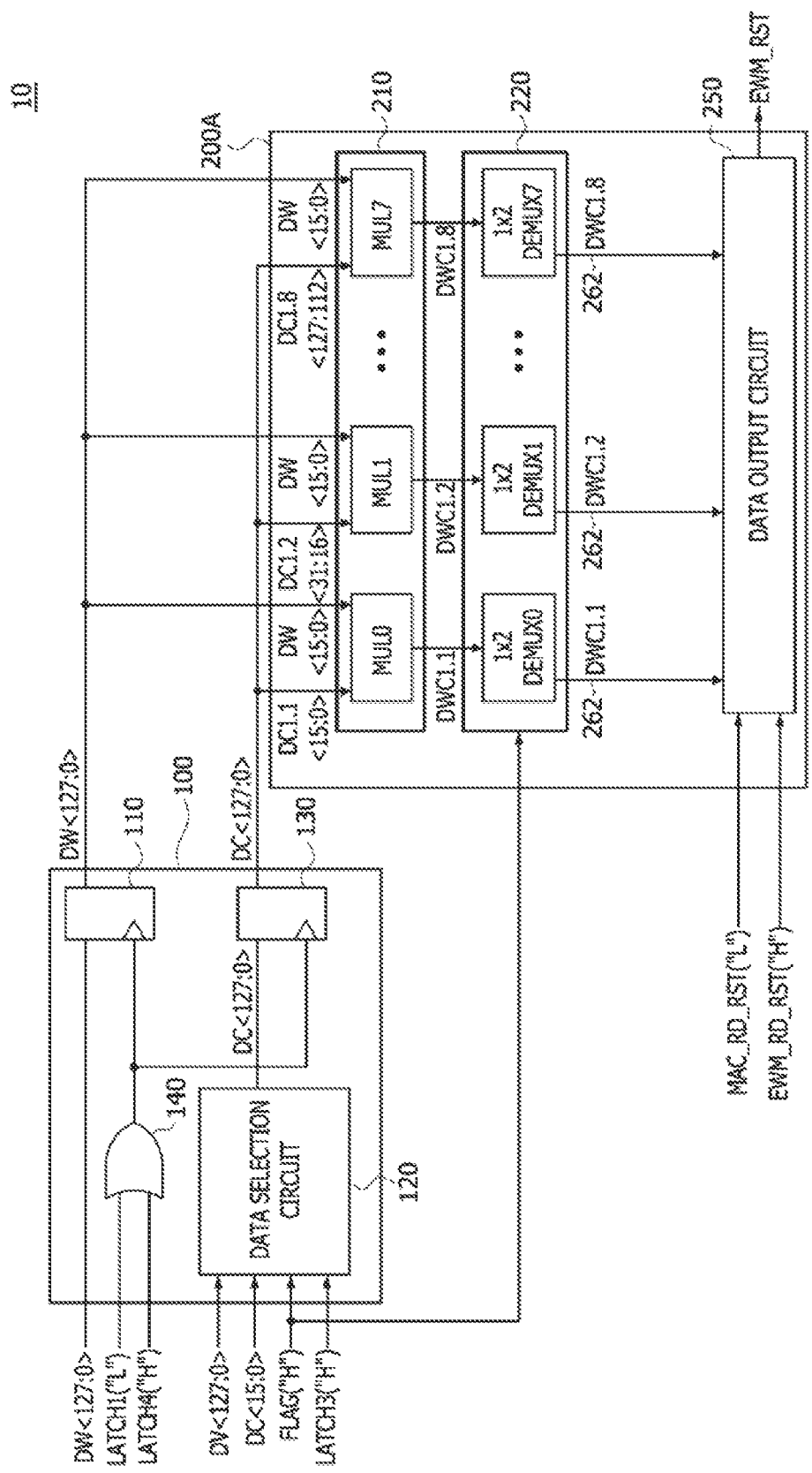
FIG. 8 illustrates an EWM arithmetic operation performed by the MAC circuit illustrated in FIG. 1.

FIG. 8 illustrates the EWM arithmetic operation of the MAC circuit 10 illustrated in FIG. 1 when the MAC operator 200A is employed in the MAC circuit 10. In FIG. 8, the same reference numerals and the same reference symbols as used in FIGS. 1 and 6 may denote the same components. Thus, detailed descriptions of the same components as described with reference to FIGS. 1 and 6 will be omitted hereinafter. The present embodiment will be described in conjunction with the EWM arithmetic operation performed by the matrix multiplication of the weight matrix and the constant number illustrated in FIG. 5.

Referring to FIG. 8, the 128-bit weight data D 127:0> may be inputted to the first input latch 110 of the data input circuit 100. The 128-bit weight data DW<127:0> may be comprised of the elements W1.1~W1.8 which are located at cross points of the first row R1 and the first to eighth columns C1~C8 of the weight matrix. The 128-bit vector data DV<127:0> and the 16-bit constant data DC<15:0> may be inputted to the data selection circuit 120. The 128-bit vector data DV<127:0> may be comprised of the elements V1.1~V8.1 which are located at cross points of the first to eighth rows R1~R8 and the column C1 of the vector matrix. In addition, to the flag signal FLAG having a logic "high (H)" level and the third latch control signal LATCH3 having a logic "high(H)" level may be inputted to the data selection circuit 120. As described with reference to FIGS. 2 and 3, the third input latch 121 of the data selection circuit 120 may receive and transmit the 16-bit constant data DC<15:0> to the bit copy block 122 in response to the third latch control signal LATCH3 having a logic "high(H)" level. The bit copy block 122 may copy the 16-bit constant data DC<15:0> to generate and output the 128-bit replica constant data DC<127:0> to the first input terminal IN1 of the data selection output circuit (123 of FIG. 2). The data selection output circuit 123 may output the 128-bit replica constant data DC<127:0> in response to the flag signal FLAG having a logic "high(H)" level. The 128-bit replica constant data DC<127:0> outputted from the data selection circuit 120 may be transmitted to the second input latch 130.

The OR gate 140 of the data input circuit 100 may receive the first latch control signal LATCH1 having a logic "low (L)" level and the fourth latch control signal LATCH4 having a logic "high(H)" level. The OR gate 140 may generate and output a signal having a logic "high(H)" level to the first input latch 110 and the second input latch 130. The first input latch 110 may output the 128-bit weight data DW<127:0> to the MAC operator 200A based on the signal having a logic "high(H)" level outputted from the OR gate 140, and the second input latch 130 may output the 128-bit constant data DC<127:0> to the MAC operator 200A based on the signal having a logic "high(H)" level outputted from the OR gate 140.

The 128-bit weight data DW<127:0> inputted to the MAC operator 200A may be divided into eight groups of element data which are inputted to respective ones of the first to eighth multipliers MUL0~MUL7 of the multiplication circuit 210, in the same way as described with reference to FIG. 7. The 128-bit replica constant data DC<127:0> inputted to the MAC operator 200A may be divided into eight groups of the original constant data DC<15:0>, which are inputted to respective ones of the first to eighth multipliers MUL0~MUL7 of the multiplication circuit 210.

The first to eighth multipliers MUL0~MUL7 included in the multiplication circuit 210 may perform multiplying calculations of the weight data and the constant data to generate and output first to eighth multiplication result data DWC1.1, DWC1.2, . . . , and DWC1.8, respectively. The first to eighth multiplication result data DWC1.1, DWC1.2, . . . , and DWC1.8 outputted from respective ones of the first to eighth multipliers MUL0~MUL7 may be inputted to the first to eighth demultiplexers DEMUX0~DEMUX7 of the data output selection circuit 220, respectively. The first to eighth demultiplexers DEMUX0~DEMUX7 may output the first to eighth multiplication result data DWC1.1, DWC1.2, . . . , and DWC1.8 through the second output lines 262 in response to the flag signal FLAG having a logic "high(H)" level, respectively. The first to eighth multiplication result data DWC1.1, DWC1.2, . . . , and DWC1.8 outputted from the first to eighth demultiplexers DEMUX0~DEMUX7 may be transmitted to the data output circuit 250.

In an embodiment, the data output circuit 250 may output the first to eighth multiplication result data DWC1.1, DWC1.2, . . . , and DWC1.8 as first EWM result data EWM_RST1 in response to the EWM result data output control signal EWM_RD_RST having a logic "'high(H)" level. In such a case, the first EWM result data EWM_RST1 may correspond to elements C~W1.1, C~W1.2, . . . , and C~W1.8 located at cross points of the first row R1 and first to eighth columns C1~C8 of the result matrix illustrated in FIG. 5. In another embodiment, because the matrix multiplications for all of elements of the weight matrix and the constant number are not completed, the EWM result data output control signal EWM_RD_RST inputted to the data output circuit 250 may have a logic "low(L)" level. In such a case, the data output circuit 250 may inhibit the first EWM result data EC_RST1 from being outputted from the data output circuit 250 and may maintain an output standby state of the first to eighth multiplication result data DWC1.1, DWC1.2, . . . , and DWC1.8.

Figure 9:
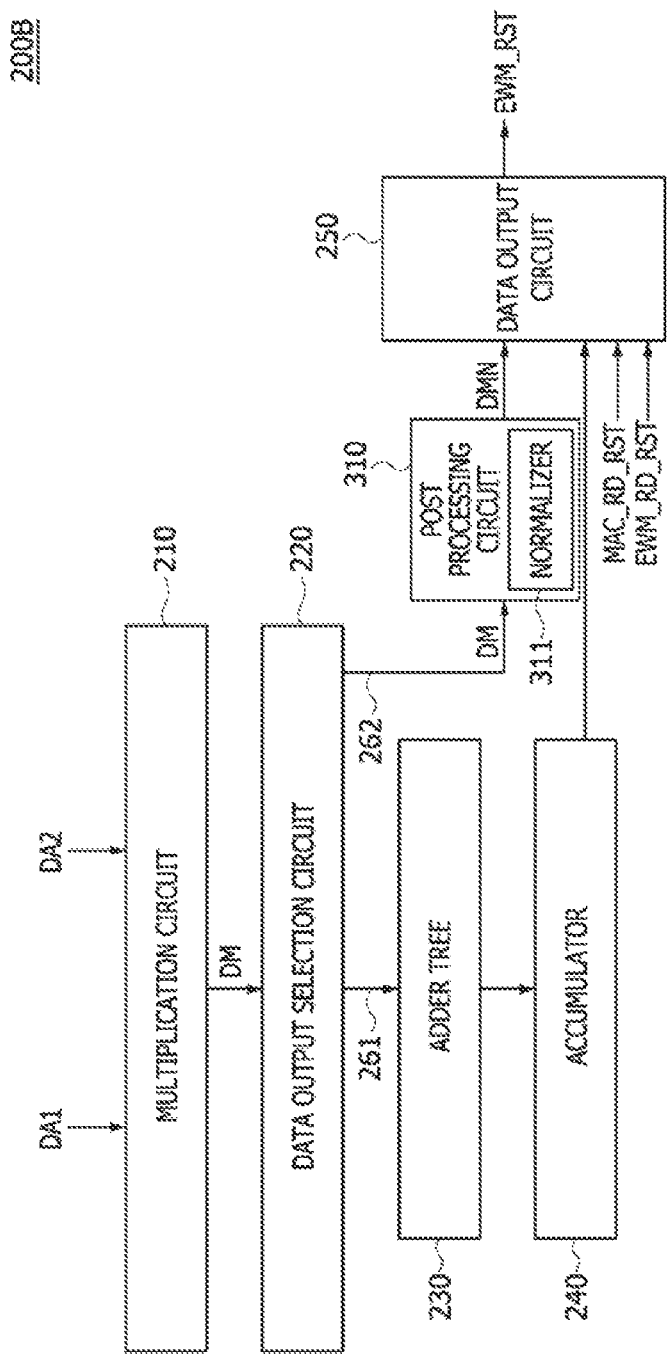
FIG. 9 is a block diagram illustrating another example of a MAC operator included in the MAC circuit illustrated in FIG. 1.

FIG. 9 is a block diagram illustrating a configuration of a MAC operator 200B corresponding to another example of the MAC operator 200 included in the MAC circuit 10 illustrated in FIG. 1. In FIG. 9, the same reference numerals and the same reference symbols as used in FIG. 6 may denote the same components. Thus, detailed descriptions of the same components as described with reference to FIG. 6 will be omitted hereinafter, Referring to FIG. 9, the MAC operator 200B may further include a post-processing circuit 310 coupled between the data output circuit 250 and the second output lines 262 of the data output selection circuit 220 as compared with the MAC operator 200A of FIG. 6, In an embodiment, the post-processing circuit 310 may include a normalizer 311.

In general, when the first input data DA1 and the second input data DA2 inputted to the MAC operator 200B have a floating-point type which is expressed with a sign, an exponent, and a mantissa, the multiplication circuit 210 may apply a normalization process for shifting the mantissa in a right direction or a left direction and for increasing or reducing the exponent according to shift of the mantissa to the multiplication result data. However, when the normalization process is performed in the multiplication circuit 210, an efficiency of a layout area of the MAC operator 200B may be degraded. Accordingly, the normalization process may be omitted in the multiplication circuit 210 and may be performed in the adder tree 230 or the accumulator 240. In such a case, if the EWM arithmetic operation is performed such that the multiplication result data DM generated by the multiplication circuit 210 are outputted through the second output lines 262 of the data output selection circuit 220, it may be impossible to apply the normalization process to the multiplication result data DM, Thus, according to the present embodiment, the MAC operator 200B may be designed to include the post-processing circuit 310, and the normalizer 311 of the post-processing circuit 310 may apply the normalization process to the multiplication result data DM even though the EWM arithmetic operation is performed. The normalizer 311 may execute the normalization process for the multiplication result data DM to generate and output nor realized multiplication result data DMI to the data output circuit 250.

Figure 10:
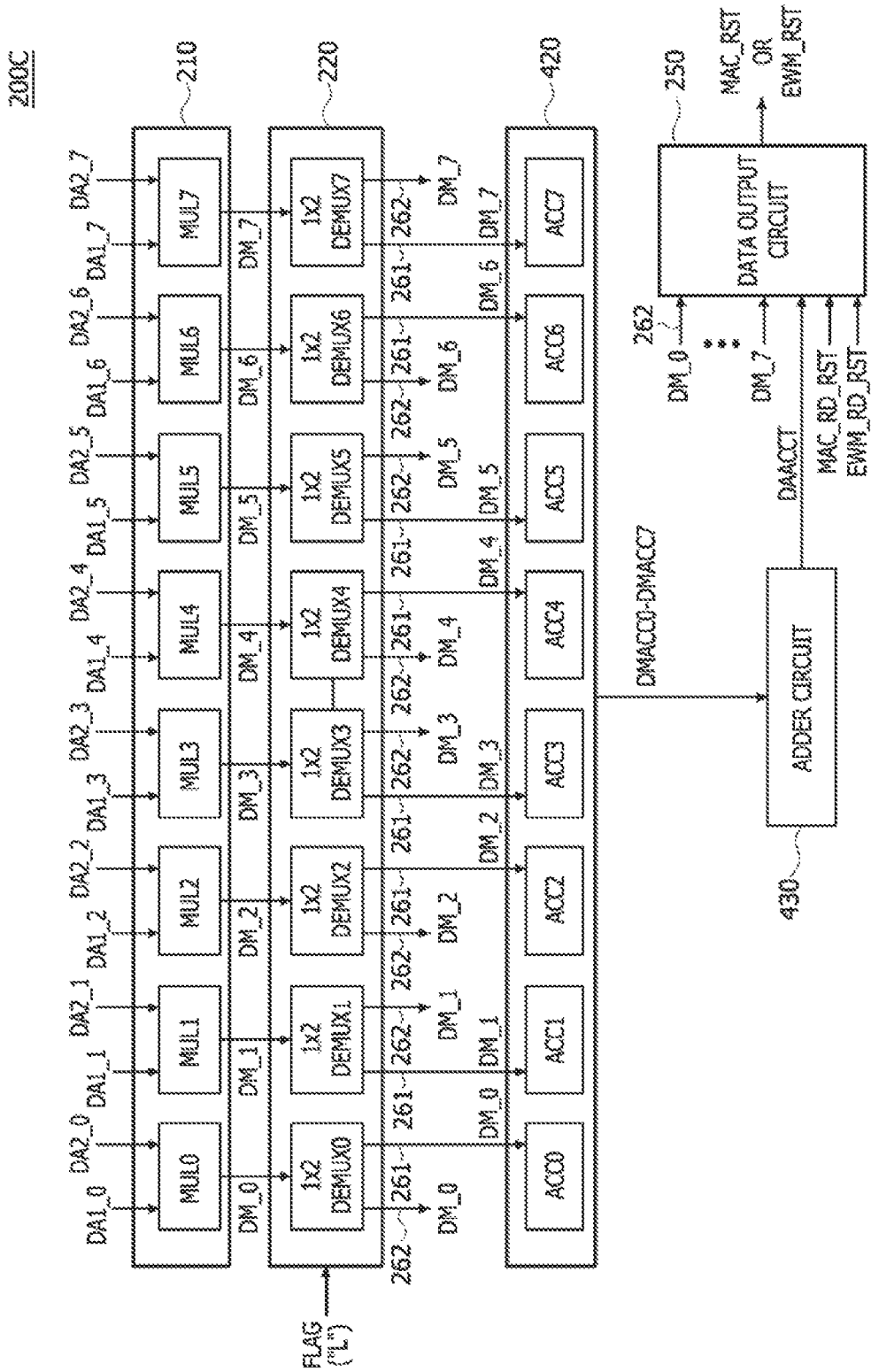
FIG. 10 is a block diagram illustrating yet another example of a MAC operator included in the MAC circuit illustrated in FIG. 1.

FIG. 10 is a block diagram illustrating a configuration of a MAC operator 200C corresponding to yet another example of the MAC operator 200 included in the MAC circuit 10 illustrated in FIG. 1. In FIG. 10, the same reference numerals and the same reference symbols as used in FIG. 6 may denote the same components. Referring to FIG. 10, the MAC operator 200C may include the multiplication circuit 210, the data output selection circuit 220, an accumulation circuit 420, an adder circuit 430, and the data output circuit 250. The multiplication circuit 210, the data output selection circuit 220, and the data output circuit 250 may have the same configurations as described with reference to FIG. 6. The MAC arithmetic operation of the MAC operator 200C may be achieved by executing a plurality of multiplying calculations and a plurality of accumulating calculations and by executing a plurality of adding calculations for the accumulation result data.

The accumulation circuit 420 may include a plurality of to accumulators, for example, first to eighth accumulators ACC0~ACC7 which are disposed in parallel. The first to eighth accumulators ACC0~ACC7 may be coupled to the first output lines 261 of the first to eighth demultiplexers DEMUX0~DEMUX7 in the data output selection circuit 220, respectively. Thus, the first accumulator ACC0 may execute accumulating calculations of the first multiplication result data DM_0 that are outputted from the first multiplier MUL0 and are transmitted through the first output line 261 of the first demultiplexer DEMUX0, and the second accumulator ACC1 may execute accumulating calculations of the second multiplication result data DM_1 that are outputted from the second multiplier MUL1 and are transmitted through the first output line 261 of the second demultiplexer DEMUX1, In the same way, each of the remaining accumulators (i.e., the third to eighth accumulators ACC2~ACC7) may execute accumulating calculations. Each of the first to eighth accumulators ACC0~ACC7 play have the same configuration as the accumulator 240 described with reference to FIG. 6. Hereinafter, the MAC arithmetic operation of the MAC operator 200C will be described in conjunction with the matrix multiplication of the weight matrix and the vector matrix which are illustrated in FIG. 4. Meanwhile, the EWM arithmetic operation of the MAC operator 200C may be performed in the same way as the EWM arithmetic operation of the MAC operator 200A described with reference to FIG. 8. Thus, descriptions of the EWM arithmetic operation of the MAC operator 200C will be omitted hereinafter.

As described with reference to FIG. 7, in the first MAC arithmetic operation, the first multiplier MUL0 of the MAC operator 200C may receive the weight data DW1.1 (as the first input data DA1_0 of FIG. 10) corresponding to the element W1.1 located at a cross point of the first row R1 and the first column C1 of the weight matrix and the vector data DV1.1 (as the second input data DA2_0 of FIG. 10) corresponding to the element V1.1 located at a cross point of the first row R1 and the column C1 of the vector matrix. The first multiplier MUL0 may perform a multiplying calculation of the weight data DW1.1 and the vector data DV1.1 to generate and output the first multiplication result data DWV1.1 (as the first multiplication result data DM_0 of FIG. 10) of the first MAC arithmetic operation. The first demultiplexer DEMUX0 of the data output selection circuit 220 may transmit the first multiplication result data DWV1.1 to the first accumulator ACC0 through the first output line 261 of the first demultiplexer DEMUX0 in response to the flag signal FLAG having a logic "low(L)" level. The first accumulator ACC0 may latch the first multiplication result data DWV1.1 of the first MAC arithmetic operation. In the same way as described above, the remaining second to eighth accumulators ACC1, . . . , and ACC7 may also latch second to eighth multiplication result data of the first MAC arithmetic operation, respectively.

In the second MAC arithmetic operation, the first multiplier MUL0 of the MAC operator 200C may receive the weight data DW1.9 (as the first input data DA1_0 of FIG. 10) corresponding to the element W1.9 located at a cross point of the first row R1 and the ninth column C9 of the weight matrix and the vector data DV9.1 (as the second input data DA2_0 of FIG. 10) corresponding to the element V9.1 located at a cross point of the ninth row R9 and the column C1 of the vector matrix. The first multiplier MUL0 may perform a multiplying calculation of the weight data DW1.9 and the vector data DV9.1 to generate and output the first multiplication result data DWV1.9 (as the first multiplication result data DM_0 of FIG. 10) of the second MAC arithmetic operation. The first demultiplexer DEMUX0 of the data output selection circuit 220 may transmit the first multiplication result data DWV1.9 to the first accumulator ACC0 through the first output line 261 of the first demultiplexer DEMUX0 in response to the flag signal FLAG having a logic "low (L)" level. The first accumulator ACC0 may add the first multiplication result data DWV1.9 to the first multiplication result data DWV1.1 to generate and latch first accumulated data DMACC0. In the same way as described above, the remaining second to eighth accumulators ACC1, . . . , and ACC7 may also latch second to eighth multiplication result data of the second MAC arithmetic operation, respectively.

The third to 64$^{th}$ MAC arithmetic operations may also be performed in the same way as described above. The element MAC_RST1.1 located at the first row R1 and the column C1 of the result matrix, which is obtained as a result of the matrix multiplication of the elements W1.1~W1.512 arrayed in the first row R1 of the weight matrix and the elements V1.1~V512.1 arrayed in the column C1 of the vector matrix by the first to 64$^{th}$ MAC arithmetic operations, may be divided into 8 groups of data and the 8 groups of data may be latched by respective ones of the first to eighth accumulators ACC0~ACC7. For example, the first accumulator ACC0 of the accumulation circuit 420 may accumulate all of the first multiplication result data generated during the first to 64$^{th}$ MAC arithmetic operations to generate first final multiplication result data DMACC0. Similarly, the second to eighth accumulators ACC7~ACC7 of the accumulation circuit 420 may also accumulate all of the second to eighth multiplication result data generated during the first to 64$^{th}$ MAC arithmetic operations to generate second to eighth final multiplication result data DMACC1~DMACC7, respectively, The first to eighth final multiplication result data DMACC0~DMACC7 generated by the first to eighth accumulators ACC0~ACC7 of the accumulation circuit 420 may be transmitted to the adder circuit 430. The adder circuit 430 may add all of the first to eighth final multiplication result data DMACC0~DMACC7 to generate and output total accumulation result data DMACCT. The total accumulation result data DMACCT outputted from the adder circuit 430 may correspond to the element MAC_RST1.1 located at the first row R1 and the column C1 of the result matrix, which is obtained by the matrix multiplication of the elements W1.1~W1.512 arrayed in the first row R1 of the weight matrix and the elements V1.1~V512.1 arrayed in the column C1 of the vector matrix. The data output circuit 250 may receive and output the total accumulation result data DMACCT as the MAC result data MAC_RST which are transmitted to an external device of the MAC operator 200C.

Figure 11:
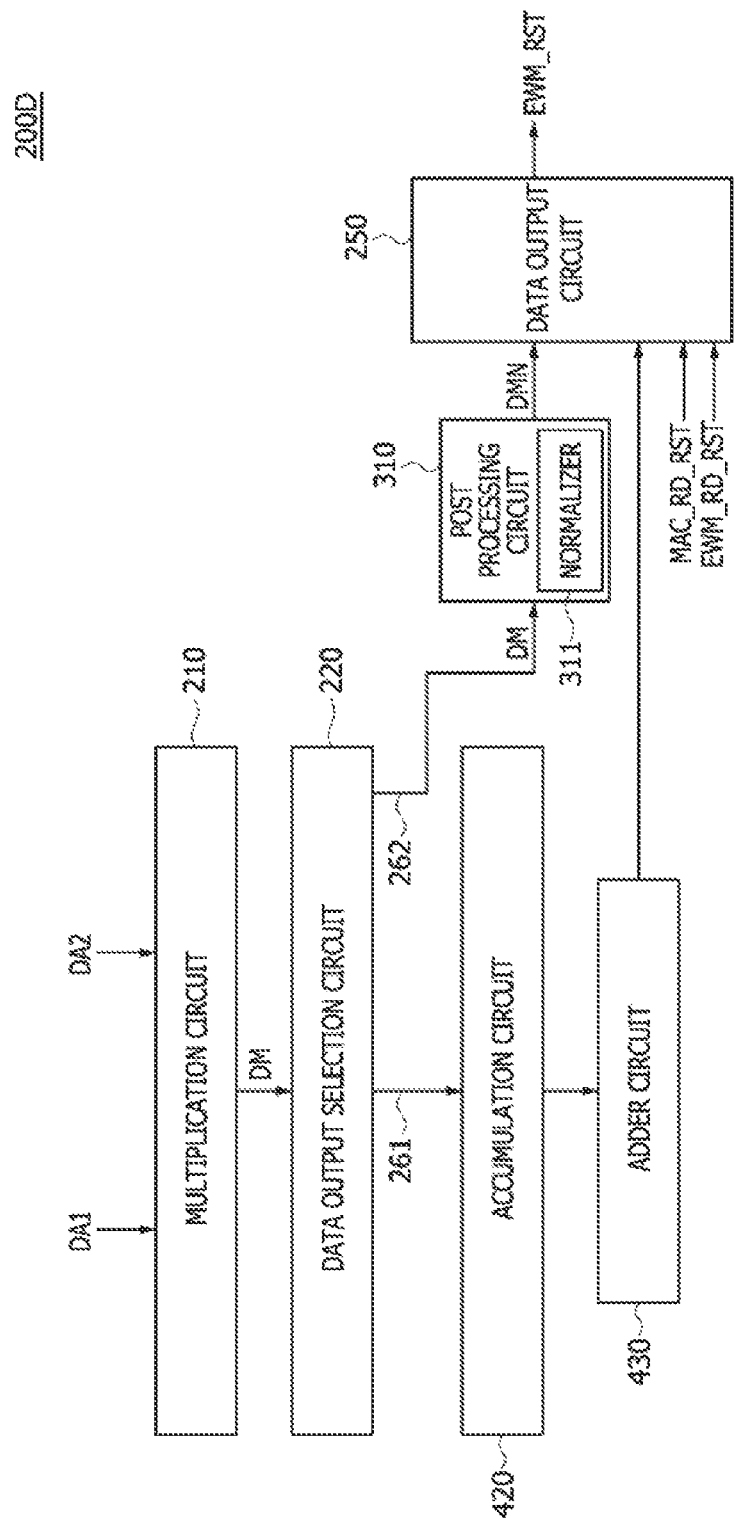
FIG. 11 is a block diagram illustrating still another example of a MAC operator included in the MAC circuit illustrated in FIG. 1.

FIG. 11 is a block diagram illustrating a configuration of a MAC operator 200D corresponding to still another example of the MAC operator 200 included in the MAC circuit 10 illustrated in FIG. 1, In FIG. 11, the same reference numerals and the same reference symbols as used in FIG. 10 may denote the same components. Referring to FIG. 11, the MAC operator 200D may further include the post-processing circuit 310 coupled between the data output circuit 250 and the second output lines 262 of the data output selection circuit 220 as compared with the MAC operator 200C illustrated in FIG. 10. In an embodiment, the post-processing circuit 310 may include the normalizer 311, as described with reference to FIG. 9, Thus, the normalizer 311 of the post-processing circuit 310 may receive the multiplication result data DM, which are outputted from the data output selection circuit 220 through the second output lines 262. In addition, the normalizer 311 may perform the normalization process for the multiplication result data DM to generate and output the normalized multiplication result data DMN to the data output circuit 250. The data output circuit 250 may output the normalized multiplication result data DMN as the EWM result data EWM_RST.

Figure 12:
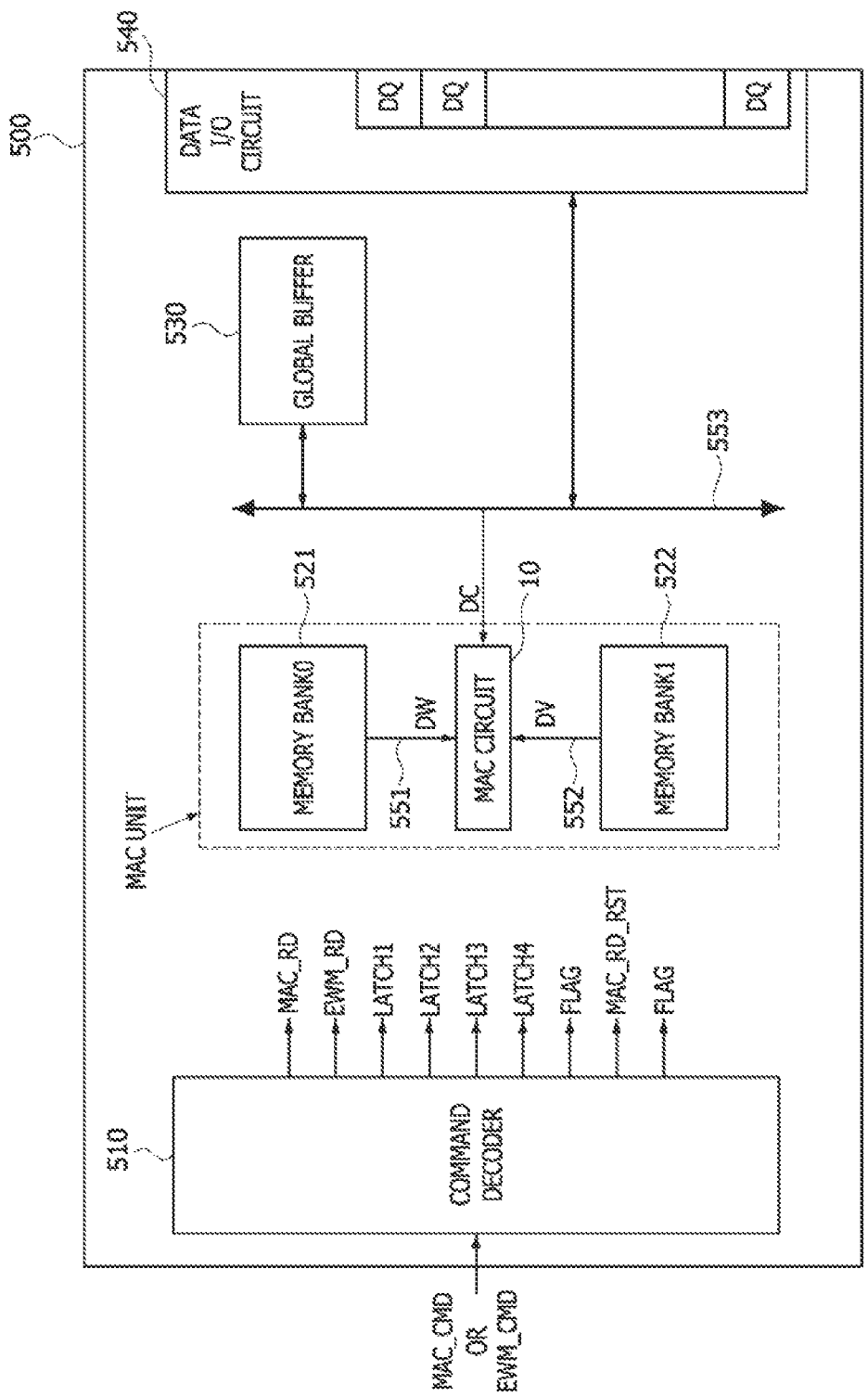
FIG. 12 is a block diagram illustrating a PIM device according to an embodiment of the present teachings.

FIG. 12 is a block diagram illustrating a PIM device 500 according to an embodiment of the present teachings. Referring to FIG. 12, the PIM device 500 may include a command decoder 510, the MAC circuit 10 illustrated in FIG. 1, a first memory bank (MEMORY BANK0) 521, a second memory bank (MEMORY BANK1) 522, a global buffer 530, and a data input/output (I/O) circuit 540. The first memory bank (MEMORY BANK0) 521 may include a first memory region storing weight data DW corresponding to the elements arrayed in any one (e.g., the first row R1) of the rows R1~R512 of the weight matrix illustrated in FIG. 4 (or FIG. 5). The second memory bank (MEMORY BANK1) 522 may include a second memory region storing vector data DV corresponding to the elements V1.1~V512.1 arrayed in the column C1 of the vector matrix illustrated in FIG. 4. The global buffer 530 may include a third memory region storing the constant data DC corresponding to the constant number C illustrated in FIG. 5.

The MAC circuit 10 may receive the weight data DW and the vector data DV from the first memory bank 521 and the second memory bank 522 to perform the MAC arithmetic operation of the weight data DW and the vector data DV. In an embodiment, the MAC circuit 10 may receive the weight data DW from the first memory bank 521 through a first bank data transmission line 551. In addition, the MAC circuit 10 may receive the vector data DV from the second memory bank 522 through a second bank data transmission line 552. The first bank data transmission line 551 may provide a data transmission path between the first memory bank 521 and the MAC circuit 10. The second bank data transmission line 552 may provide a data transmission path between the second memory bank 522 and the MAC circuit 10. The first memory bank 521, the MAC circuit 10, and the second memory bank 522 may constitute one MAC unit. although not shown in the drawings, the PIM device 500 may include a plurality of MAC units.

Alternatively, the MAC circuit 10 may receive the weight data DW and the constant data DC from the first memory bank 521 and the global buffer 530 to perform the EWM arithmetic operation of the weight data DW and the constant data DC. The MAC circuit 10 may receive the weight data DW from the first memory bank 521 through the first bank data transmission line 551. In addition, the MAC circuit 10 may receive the constant data DC from the global buffer 530 through a global data transmission line 553. The global data transmission line 553 may act as a multipurpose data transmission path in the PIM device 500. In another embodiment, the MAC circuit 10 may directly receive the constant data DC from an external device (not shown), which is coupled to the PIM device 500, through data I/O pins DQ of the data I/O circuit 540. In such a case, the constant data DC inputted to the data I/O circuit 540 may be to transmitted to the MAC circuit 10 through the global data transmission line 553.

In the PIM device 500 according to the present embodiment, the MAC circuit 10 constituting the MAC unit may correspond to the MAC circuit 10 described with reference to FIGS. 1 to 11. Thus, the MAC circuit 10 may selectively perform the MAC arithmetic operation of the weight data DW and the vector data DV or the EWM arithmetic operation of the weight data DW and the constant data DC. The MAC arithmetic operation of the MAC circuit 10 may be controlled by various MAC control signals which are generated by the command decoder 510 based on a MAC command MAC_CMD provided by an external device. The EWM arithmetic operation of the MAC circuit 10 may be controlled by various EWM control signals which are generated by the command decoder 510 based on a EWM command EWM_CMD provided by an external device.

When the MAC command MAC_CMD is transmitted to the command decoder 510, the command decoder 510 may decode the MAC command MAC_CMD to generate various MAC control signals (e.g., a MAC read control signal MAC_RD, the first latch control signal LATCH1 having a logic "high(H)" level, the second latch control signal LATCH2 having a logic "high(H)" level, the third latch control signal LATCH3 having a logic "low(L)" level, the fourth latch control signal LATCH4 having a logic "low(L)" level, the flag signal FLAG having a logic "low(L)" level, and the MAC result data output control signal MAC_RD_RST) which are described with reference to FIG. 7. The MAC read control signal MAC_RD may be transmitted to the first memory bank 521 and the second memory bank 522. The first memory bank 521 and the second memory bank 522 may output the weight data DW and the vector data DV in response to the MAC read control signal MAC_RD, respectively. If the MAC arithmetic operation of the MAC circuit 10 terminates, the MAC result data output control signal MAC_RD_RST for controlling an output operation of the MAC result data may be transmitted from the command decoder 510 to the MAC circuit 10. The MAC arithmetic operation performed by the MAC circuit 10 based on the MAC control signals may be the same as the MAC arithmetic operation described with reference to FIG. 7.

When the EWM command EWM_CMD is transmitted to the command decoder 510, the command decoder 510 may decode the EWM command EWM_CMD to generate various EWM control signals (e.g., an EWM read control signal EWM_RD, the first latch control signal LATCH1 having a logic "low(L)" level, the second latch control signal LATCH2 having a logic "low(L)" level, the third latch control signal LATCH3 having a logic "high(H)" level, the fourth latch control signal LATCH4 having a logic "high (H)" level, the flag signal FLAG having a logic "high(H)" level, and the EWM result data output control signal EWM_RD_RST) which are described with reference to FIG. 8. In similar fashion as illustrated in FIG. 12, the EWM read control signal EWM_RD may be transmitted to the first memory bank 521 and the global buffer 530. The first memory bank 521 and the global buffer 530 may output the weight data DW and the constant data DC in response to the EWM read control signal EWM_RD, respectively. If the EWM arithmetic operation of the MAC circuit 10 terminates, the EWM result data output control signal EWM_RD_RST for controlling an output operation of the EWM result data may be transmitted from the command decoder 510 to the MAC circuit 10. The EWM arithmetic operation performed by the MAC circuit 10 based on the EWM control signals may be the same as the EWM arithmetic operation described with reference to FIG. 8.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple to embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:
1. A processing-in-memory (PIM) device comprising:
a first memory bank configured to store weight data comprised of elements of a weight matrix;
a second memory bank configured to store vector data comprised of elements of a vector matrix;
a buffer configured to store constant data; and
a multiplication-and-accumulation (MAC) circuit configured to selectively perform at least one of: a MAC arithmetic operation of the weight data and the vector data, and an element-wise multiplication (EWM) arithmetic operation of the weight data and the constant data,
wherein the MAC circuit comprising:
a MAC operator circuit configured to selectively perform the MAC arithmetic operation or the EWM arithmetic operation; and
a data input circuit configured to provide the MAC operator circuit with the weight data, the vector data, and the constant data,
wherein the data input circuit comprising:
a first input latch configured to latch the weight data and output latched weight data to the MAC operator circuit;
a data selection circuit configured to receive the vector data and the constant data to selectively output the vector data or the constant data according to the selected arithmetic operation; and
a second input latch configured to latch output data of the data selection circuit and output latched output data to the MAC operator circuit, and
wherein the data selection circuit includes:
a third input latch configured to latch and output the constant data;

a bit copy block configured to copy the constant data outputted from the third input latch to generate and output replica constant data; and a data selection output circuit configured to selectively output the replica constant data or the vector data.

2. The PIM device of claim 1, wherein the MAC circuit is configured to:
receive the weight data from the first memory bank through a first bank data transmission line;
receive the vector data from the second memory bank through a second bank data transmission line; and
receive the constant data from the buffer through a buffer data transmission line.

3. The PIM device of claim 1, further comprising a command decoder configured to decode a MAC command provided to the PIM device by an external device, said externally-provided MAC command generating MAC control signals for controlling the MAC arithmetic operation of the MAC circuit and configured to decode an EWM command provided by the external device to generate EWM control signals for controlling the EWM arithmetic operation of the MAC circuit.

4. The PIM device of claim 1, wherein the MAC operator circuit includes:
a multiplication circuit comprising a plurality of multipliers;
a data output selection circuit configured to receive data that is output from the plurality of multipliers and output said output data of the plurality of multipliers through first output lines or second output lines of the data output selection circuit;
an adder tree comprising a plurality of adders; and
an accumulator configured to perform an accumulating calculation of data outputted from the adder tree.

5. The PIM device of claim 4, wherein the first output lines of the data output selection circuit are coupled to corresponding adders of the adder tree.

6. The PIM device of claim 5, wherein the MAC operator circuit further includes a data output circuit coupled to the second output lines of the data output selection circuit and an output terminal of the accumulator.

7. The PIM device of claim 4,
wherein the demultiplexers are configured to receive output data from the plurality of multipliers and output the output data of the plurality of multipliers through the first output lines or the second output lines.

8. The PIM device of claim 7, wherein the demultiplexers are configured to either:
transmit the output data from the plurality of multipliers to the adder tree through the first output lines when the MAC operator performs the MAC arithmetic operation; or transmit the output data of the plurality of multipliers to a data output circuit through the second output lines when the MAC operator performs the EWM arithmetic operation;
responsive to said control signal.

9. The PIM device of claim 8, wherein the MAC operator circuit further includes a normalizer that is coupled between the data output circuit and the second output lines of the data output selection circuit to execute a normalization process for data which are transmitted through the second output lines.

10. The PIM device of claim 4, wherein the accumulator includes:
an accumulative adder configured to perform an adding calculation for adding feedback data to data outputted from the adder tree; and
a latch circuit configured to latch output data of the accumulative adder to generate the feedback data which are transmitted to the accumulative adder.

11. The PIM device of claim 1, wherein the replica constant data are generated to have the same number of bits as the weight data.

12. The PIM device of claim 1, wherein the data input circuit additionally comprises an OR gate that performs a logical OR operation of a first latch control signal for the MAC arithmetic operation and a fourth latch control signal for the EWM arithmetic operation to output a result signal of the logical OR operation to clock terminals of the first and second input latches.

13. The PIM device of claim 12,
wherein the third input latch outputs the constant data in response to a third latch control signal having a first logic level; and
wherein output data of the data selection output circuit are selected according to a logic level of a flag signal.

* * * * *